(12) United States Patent
Athinarayanan et al.

(10) Patent No.: US 7,795,181 B2
(45) Date of Patent: Sep. 14, 2010

(54) OXIDE HIGH-TEMPERATURE SUPERCONDUCTOR AND ITS PRODUCTION METHOD

(75) Inventors: Sundaresan Athinarayanan, Tsukuba (JP); Hideo Ihara, Tsukuba (JP); Yoshiko Ihara, legal representative, Tsukuba (JP); Hideyo Ihara, legal representative, Otsuka (JP); Hidetaka Ihara, legal representative, Otsuka (JP); Gen-ei Ihara, legal representative, Takamatsu (JP); Chiaki Ihara, legal representative, Oyaguchi Kita-machi (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 1343 days.

(21) Appl. No.: 10/487,415

(22) PCT Filed: Sep. 5, 2002

(86) PCT No.: PCT/JP02/09049

§ 371 (c)(1),
(2), (4) Date: Feb. 23, 2004

(87) PCT Pub. No.: WO03/023094

PCT Pub. Date: Mar. 20, 2003

(65) Prior Publication Data

US 2004/0254078 A1  Dec. 16, 2004

(30) Foreign Application Priority Data

Sep. 6, 2001  (JP) ............................. 2001-270445

(51) Int. Cl.
*H01L 39/24*  (2006.01)
(52) U.S. Cl. ...................... 505/237; 505/238; 505/782; 505/783

(58) Field of Classification Search ................. 505/237, 505/238
See application file for complete search history.

(56) References Cited

U.S. PATENT DOCUMENTS 5,464,812 A * 11/1995 Inada et al. ................. 505/237

(Continued)

FOREIGN PATENT DOCUMENTS

EP  0 884 787  12/1998

(Continued)

OTHER PUBLICATIONS

J. D. O'Connor et al.; Applied Physics Letters, vol. 69, No. 1, pp. 115-117, Jul. 1, 1996. Cited in the PCT search report.

(Continued)

*Primary Examiner*—Stanley Silverman
*Assistant Examiner*—Paul A Wartalowicz
(74) *Attorney, Agent, or Firm*—Westerman, Hattori, Daniels & Adrian, LLP

(57) ABSTRACT

An oxide high temperature superconductor and method of making which includes a first buffer layer composed of $CeO_3$ formed on a sapphire R (1, −1, 0, 2) face substrate for reducing lattice mismatch between the sapphire R (1, −1, 0, 2) face substrate and the oxide high temperature superconductor thin film, and a second buffer layer composed of such an oxide high temperature superconductor but in which Ba is substituted with Sr formed on the first buffer layer. The first buffer layer reduces the lattice mismatch between the sapphire R (1, −1, 0, 2) face substrate and the oxide high temperature superconductor thin, the second buffer layer prevents an interfacial reaction with Ba, thereby permitting the epitaxial growth of an oxide high temperature superconductor thin film that excels in both crystallographic integrity and crystallographic orientation.

4 Claims, 4 Drawing Sheets

U.S. PATENT DOCUMENTS

| | | | | |
|---|---|---|---|---|
| 5,502,029 A | * | 3/1996 | Doi et al. | 505/234 |
| 5,571,777 A | * | 11/1996 | Tanaka et al. | 505/237 |
| 5,845,395 A | * | 12/1998 | Honjo | 29/846 |
| 6,096,434 A | * | 8/2000 | Yano et al. | 428/446 |

FOREIGN PATENT DOCUMENTS

| | | |
|---|---|---|
| EP | 0 949 690 | 10/1999 |
| JP | 1-286920 | 11/1989 |

OTHER PUBLICATIONS

Nawazish A. Khan et al.; Superconductor Science and Technology, vol. 14, No. 8, pp. 603-606. Aug. 2001. Cited in the PCT search report.

\* cited by examiner

F I G . 1
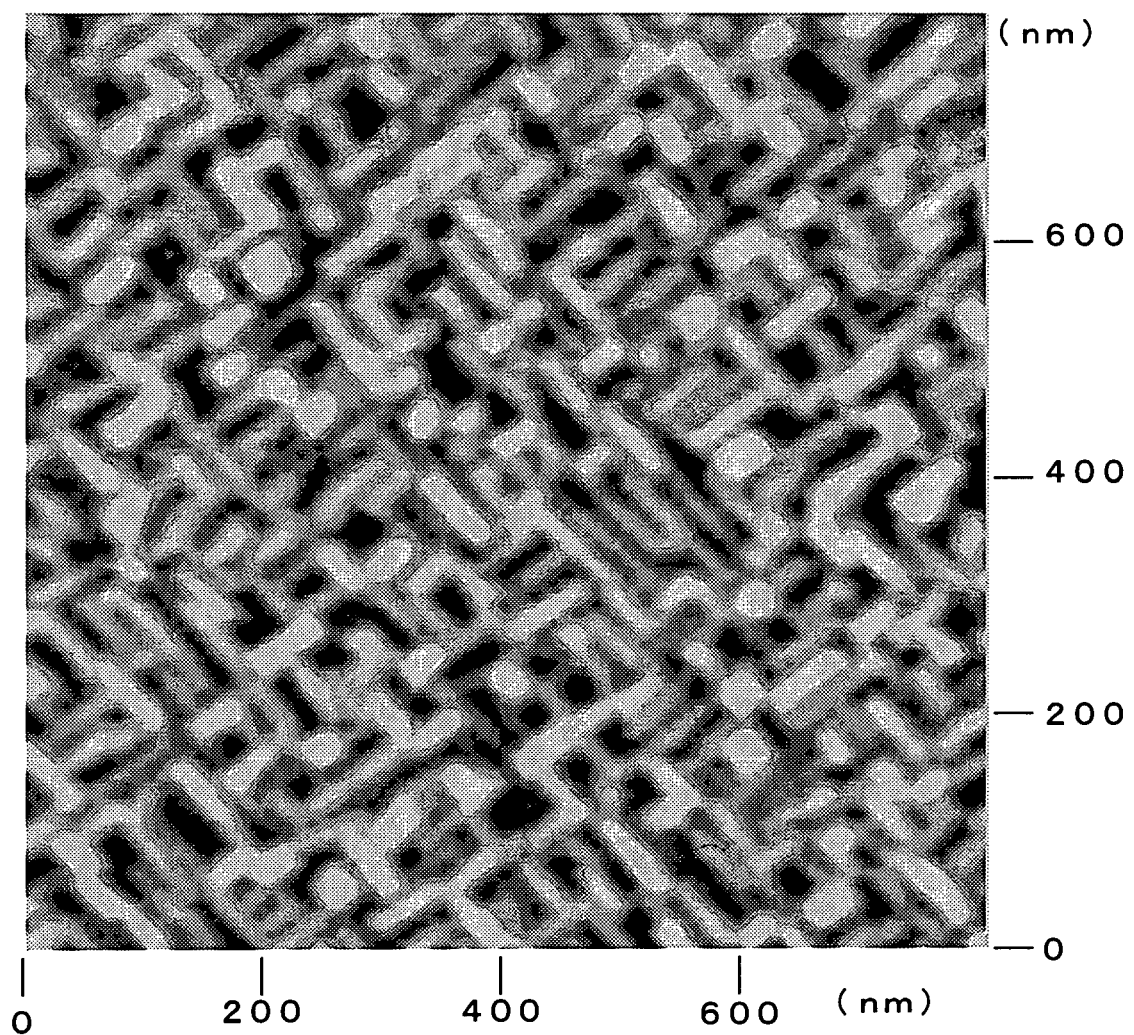

OXIDE HIGH-TEMPERATURE SUPERCONDUCTOR AND ITS PRODUCTION METHOD

TECHNICAL FIELD

The present invention relates to an oxide high temperature superconductor that excels in high-frequency properties and a method of making such an oxide high temperature superconductor.

BACKGROUND ART

Of oxide high temperature superconductors, a Cu family superconductor thin film (see Kotai Butsuri (Solid State Physics), Vol. 35, No. 5, 2000) excels in superconducting properties, and research and development efforts have diversely been devoted to putting it to practical use. The excellent superconducting characteristics which a Cu family superconductor thin film possesses include the feature that it excels in high-frequency properties as mentioned in the literature referred to above. In order to fabricate a superconductor thin film that can be applied to a high-frequency device such as a microwave device, of importance is not only the high-frequency properties of the superconductor thin film itself but also those of a substrate on which the superconductor thin film is to be epitaxially grown.

Fabricating a Cu family oxide high temperature superconductor that excels in superconducting properties requires the superconductor thin film to be excellent in both crystallographic integrity and crystallographic orientation.

For a conventional Cu family superconductor thin film, use has been made of a $SrTiO_3$ substrate that is small in lattice mismatch with such a superconductor thin film and as a result is capable of growing thereon such a superconductor thin film that is high in crystallographic integrity and excellent in crystallographic orientation. However, since it is large in dielectric constant (specific dielectric constant=about 300), $SrTiO_3$ is unsuitable to form a substrate for growing a superconductor thin film thereon for particular use in a high frequency device.

Thus, in order to be applicable to a high frequency device, there has been sought an oxide high temperature superconductor in which an oxide high temperature superconductor thin film that is high in crystallographic integrity and excellent in crystallographic orientation is formed on a substrate that is low in dielectric constant, and a method whereby such an oxide high temperature superconductor thin film can be simply epitaxially grown on such a substrate.

DISCLOSURE OF THE INVENTION

It is accordingly a first object of the present invention to provide an oxide high temperature superconductor in which an oxide high temperature superconductor thin film that is high in crystallographic integrity and excellent in crystallographic orientation is formed on a substrate that is low in dielectric constant.

A second object of the present invention is to provide a method of making an oxide high temperature superconductor thin film that is high in crystallographic integrity and excellent in crystallographic orientation is formed on a substrate that is low in dielectric constant.

In order to achieve the first object mentioned above, there is provided in accordance with the present invention as set forth in claim 1, an oxide high temperature superconductor containing Ba as a constituent element thereof and having a thin film thereof formed on a crystalline substrate, characterized in that it comprises: a first buffer layer for reducing a lattice mismatch between the said crystataline substrate and the said oxide high temperature superconductor thin film, and a second buffer layer formed on the said first buffer layer and made of an oxide high temperature superconductor that is identical or similar in crystallographic structure and lattice constant to the said oxide high temperature superconductor but in which Ba is substituted with Sr, interposed between the said crystalline substrate and the said oxide high temperature superconductor thin film. According to this makeup, Sr in the second buffer layer prevents the diffusion of Ba, and even if the first buffer layer is composed of a material that is liable to cause an interfacial reaction with Ba, the second buffer layer can prevent the interfacial reaction. Therefore, the range of choice of materials usable to form the first buffer layer is expanded to allow selecting an optimum material for reducing the lattice mismatch to a minimum. Also, since the second buffer layer is a thin film made of an oxide high temperature superconductor that is identical or similar in crystallographic structure and lattice constant to the oxide high temperature superconductor but in which merely Ba is substituted with Sr, an ultimate thin film of the oxide high temperature superconductor has excellent lattice match with the second buffer layer and is thus allowed to form with excellent crystallographic orientation in both film-thickness and in-plane directions. Consequently, an oxide high temperature superconductor prepared according to the present invention comes to exhibit excellent superconducting properties regardless of the kind of a substrate material used.

The present invention also provides as set forth in claim 2, an oxide high temperature superconductor containing Ba as a constituent element thereof and having a thin film thereof formed on a crystalline substrate, characterized in that it comprises a first buffer layer for reducing a lattice mismatch between the said crystalline substrate and the said oxide high temperature superconductor thin film, and a second buffer layer formed on the said buffer layer and made of an oxide high temperature superconductor not containing Ba but containing Sr which is similar in crystallographic structure and lattice constant to the said oxide high temperature superconductor, or a Sr oxide which is similar in crystallographic structure and lattice constant to the said oxide high temperature superconductor, these two buffer layers interposed between the said crystalline substrate and the said oxide high temperature superconductor thin film. According to this makeup, Sr in the second buffer layer prevents the diffusion of Ba, and even if the first buffer layer is composed of a material that is liable to cause an interfacial reaction with Ba, the second buffer layer can prevent the interfacial reaction. Therefore, the range of choice of materials usable to form the first buffer layer for reducing a lattice mismatch between an oxide high temperature superconductor and a substrate is expanded to allow selecting an optimum material for reducing the lattice mismatch to a minimum. Also, since the second buffer layer is well lattice-matched with the oxide high temperature superconductor, an ultimate thin film of the oxide high temperature superconductor is allowed to form with excellent crystallographic orientation in both film thickness and in-plane directions. Consequently, an oxide high temperature superconductor prepared according to the present invention comes to exhibit excellent superconducting properties regardless of the kind of a substrate material. The present invention also provides as set forth in claim 3, an oxide high temperature superconductor containing Ba as a constituent element thereof and having a thin film thereof formed on a crystalline substrate, characterized in that it comprises a buffer layer interposed between the said crystalline substrate and the said oxide high temperature superconductor thin film for reducing a lattice mismatch between them, wherein the said buffer layer reducing the lattice mismatch is made of an oxide high temperature superconductor that is identical to the said oxide high temperature superconductor except that Ba is substituted with Sr therein, or an oxide high temperature superconductor that is identical to the said oxide high temperature superconductor except not containing Ba but containing Sr, or a Sr oxide that reduces the lattice mismatch. According to this makeup, the buffer layer in which Sr prevents the diffusion of Ba allows using a substrate material that is liable to reacting with Ba and thus expands the choice of materials usable to form the substrate. Also, since the buffer layer is made of a material having a crystallographic structure and a lattice constant requited to reduce lattice mismatch between the oxide high temperature superconductor and the substrate, an ultimate thin film of the oxide high temperature superconductor is allowed to form with excellent crystallographic orientation in both film thickness and in-plane directions. Consequently, an oxide high temperature superconductor prepared according to the present invention comes to exhibit excellent superconducting properties regardless of the kind of a substrate material used.

Here, the said oxide high temperature superconductor containing Ba as a constituent element thereof as set forth in any one of claims 1 to 3 can consist of a composition expressed by composition formula: $Cu_{1-x}M_x(Ba_{1-y}Sr_y)_2(Ca_{1-z}L_z)_{n-1}(Cu_{1-q}Q_q)_nO_{2n+4-w}$ or composition formula: $(Cu_{1-x}M_x)_2(Ba_{1-y}Sr_y)_2(Ca_{1-z}L_z)_{n-1}(Cu_{1-q}Q_q)_nO_{2n+4-w}$ where:

M represents Tl, Hg, Bi, Pb, In, Ga, Al, B, C, Si, Sn, Ag, Au, S, N, P, Mo, Re, Os, Cr, Ti, V, Fe, one element in the lanthanide series, or one or more alkali metal elements, L represents Mg, Y, or one or more elements in the lanthanide series.

Q represents either or both of Mg and Zn, and $0 \leq x \leq 1, 0 \leq y \leq 1, 0 \leq z \leq 1, 0 \leq q \leq 0.1, 0 \leq w \leq 4$, and $2 \leq n \leq 5$.

According to this makeup, an oxide high temperature superconductor composed as specified above which excels in both crystallographic integrity and crystallographic orientation is allowed to form on a substrate of low dielectric constant. It should be noted here that such oxide superconductors of composition as mentioned above include so-called YBCO type, Y(Ln)-[123] type and Hg type oxide high temperature superconductors.

(Deleted)

The said crystalline substrate is preferably a sapphire substrate having a sapphire R face (1, −1, 0, 2). Also, the first buffer layer mentioned in claim 1 or claim 2 may be a $CeO_2$ layer, and then the second buffer layer may have a composition expressed by composition formula:

$Cu_{1-x}M_xSr_2CaCu_2O_{8-w}$ where

M represents Tl, Hg, Bi, Pb, In, Ga, Al, B, C, Si, Sn, Ag, Au, S, N, P, Mo, Re, Os, Cr, Ti, V, Fe, an element in the lanthanide series or one or more alkali metal elements and where x and w are represented by $0 \leq x \leq 1$ and $0 \leq w \leq 4$, respectively. According to this makeup, an oxide high temperature superconductor that excels in both crystallographic integrity and crystallographic orientation can be obtained by virtue of the fact that the second buffer layer composed of $Cu_{1-x}M_xSr_2CaCu_2O_{8-w}$ prevents the interfacial reaction between Ce in the first buffer layer composed of $CeO_2$ on the sapphire R face (1, −1, 0, 2) substrate of a low dielectric constant (as low as about 10) and Ba in the oxide high temperature superconductor thin film being epitaxially grown.

In an oxide high temperature superconductor as set forth in the present invention, the said oxide high temperature superconductor thin film containing Ba as a constituent element may be epitaxially grown whereby an amorphous phase composed to form this oxide high temperature superconductor is deposited on the said second buffer layer and the deposited amorphous phase is heat-treated in an oxygen atmosphere at a pressure of 1.0 to 10 atm in the presence of $Ag_2O$ or AgO, or alternatively in the presence of Tl.

In an oxide high temperature superconductor as set forth in the present invention, the said oxide high temperature superconductor thin film containing Ba as a constituent element may be epitaxially grown whereby an amorphous phase composed to form this oxide high temperature superconductor is deposited on the said buffer layer and the deposited amorphous phase is heat-treated in an oxygen atmosphere at a pressure of 1.0 to 10 atm in the presence of $Ag_2O$ or AgO, or alternatively in the presence of Tl.

The present invention also provides a thin film of an oxide containing Ba as a constituent element thereof formed on a sapphire R (1, −1, 0, 2) face substrate, the oxide containing Ba being one selected from the group that consists of an oxide magnetic material, an oxide dielectric and an oxide conductor, characterized in that the said thin film has a laminated structure formed by: forming a first buffer layer made of a $CeO_2$ thin film on the said sapphire substrate, forming on the said first buffer layer a second buffer layer made of a thin film of the said oxide in which Ba is substituted with Sr, and forming the said oxide on the said second buffer layer. According to this makeup, it can be possible to provide an oxide thin film that excels in properties, which contains Ba as a constituent element and is selected one from the group that consists of an oxide magnetic material, an oxide dielectric and an oxide conductor, by virtue of the fact that a thin film of an oxide containing Ba can be formed on the $CeO_2$ buffer layer on the sapphire substrate without reacting with Ce in the $CeO_2$ buffer layer.

In order to achieve the second object mentioned above there is also provided in accordance with the present invention, a method of making a thin film of an oxide high temperature superconductor containing Ba as a constituent element thereof by epitaxially growing the oxide high temperature superconductor thin film on a crystalline substrate, characterized in that it comprises the steps of: forming on the said crystalline substrate a first buffer layer adapted to reduce a lattice mismatch between the said crystalline substrate and the said oxide high temperature superconductor thin film; forming on the said first buffer layer a second buffer layer made of an oxide high temperature superconductor that is identical or similar in crystallographic structure and lattice constant to the said oxide high temperature superconductor but in which Ba is substituted with Sr, an oxide high temperature superconductor not containing Ba but containing Sr which is similar in crystallographic structure and lattice constant to the said oxide high temperature superconductor, or a Sr oxide which is similar in crystallographic structure and lattice constant to the said oxide high temperature superconductor, and epitaxially growing the said oxide high temperature superconductor thin film on the said second buffer layer. According to this method makeup, a thin film of an oxide high temperature superconductor that excels in both crystallographic integrity and crystallographic orientation can be epitaxially grown by virtue of the fact that even if the first buffer layer for reducing the lattice mismatch between the oxide high temperature superconductor thin film and the substrate is composed of a material containing a substance that is liable to interfacially reacting with Ba from the oxide high temperature superconductor thin film, the second buffer layer prevents the interfacial reaction.

In order to achieve the second object mentioned above there is also provided in accordance with the present invention a method of making a thin film of an oxide high temperature superconductor containing Ba as a constituent element thereof by epitaxially growing the oxide high temperature superconductor thin film on a crystalline substrate, characterized in that it comprises the steps of: forming on the said crystalline substrate a buffer layer adapted to reduce a lattice mismatch between the said crystalline substrate and the said oxide high temperature superconductor thin film, wherein the said buffer layer reducing the lattice mismatch is made of an oxide high temperature superconductor that is identical to the said oxide high temperature superconductor except that Ba is substituted with Sr therein, or an oxide high temperature superconductor that is identical to the said oxide high temperature superconductor except not containing Ba but containing Sr, or a Sr oxide that reduces the lattice mismatch; and epitaxially growing the said oxide high temperature superconductor thin film on the said buffer layer. According to this method makeup, the buffer layer in which Sr prevents the diffusion of Ba allows using a substrate material that is liable to reacting with Ba and thus expands the choice of materials usable to form the substrate. Also, since the buffer layer is made of a material having a crystallographic structure and a lattice constant requited to reduce lattice mismatch between the oxide high temperature superconductor and the substrate, an ultimate thin film of the oxide high temperature superconductor is allowed to form with excellent crystallographic orientation in both film thickness and in-plane directions. Consequently, an oxide high temperature superconductor prepared according to the present invention comes to exhibit excellent superconducting properties regardless of the kind of a substrate material used.

Here, the said oxide high temperature superconductor containing Ba as a constituent element thereof as set forth in the present invention can consist of a composition expressed by composition formula: $Cu_{1-x}M_x(Ba_{1-y}Sr_y)_2(Ca_{1-z}L_z)_{n-1}(Cu_{1-q}Q_q)_nO_{2n+4-w}$ or composition formula: $(Cu_{1-x}M_x)_2(Ba_{1-y}Sr_y)_2(Ca_{1-z}L_z)_{n-1}(Cu_{1-q}Q_q)_nO_{2n+4-w}$ where:
M represents Tl, Hg, Bi, Pb, In, Ga, Al, B, C, Si, Sn, Ag, Au, S, N, P, Mo, Re, Os, Cr, Ti, V, Fe, one element in the lanthanide series, or one or more alkali metal elements,
L represents Mg, Y, or one or more elements in the lanthanide series.
Q represents either or both of Mg and Zn, and
$0 \leq x \leq 1, 0 \leq y \leq 1, 0 \leq z \leq 1, 0 \leq q \leq 0.1, 0 \leq w \leq 4$, and $2 \leq n \leq 5$.

According to this makeup, an oxide high temperature superconductor composed as specified above which excels in both crystallographic integrity and crystallographic orientation is allowed to epitaxially grow on a substrate of low dielectric constant. It should be noted here that such oxide superconductors of composition as mentioned above include so-called YBCO type, Y(Ln)-[123] type and Hg type oxide high temperature superconductors.

According to this method makeup, the buffer layer can be obtained easily, that is well lattice-matched with the said oxide high temperature superconductor and at the same time acts as a barrier to the diffusion of Ba of the said oxide high temperature superconductor thin film being epitaxially grown, therefore, an oxide high temperature superconductor thin film that excels in both crystallographic integrity and crystallographic orientation can be easily epitaxially grown.

The said crystalline substrate is preferably a sapphire substrate having a sapphire R face (1, −1, 0, 2). Also, the first buffer layer may be a $CeO_2$ layer, and then the second buffer layer may have a composition expressed by composition formula:

$Cu_{1-x}M_xSr_2CaCu_2O_{8-w}$ where

M represents Tl, Hg, Bi, Pb, In, Ga, Al, B, C, Si, Sn, Ag, Au, S, N, P, Mo, Re, Os, Cr, Ti, V, Fe, an element in the lanthanide series or one or more alkali metal elements and where x and w are represented by $0 \leq x \leq 1$ and $0 \leq w \leq 4$, respectively. According to this method makeup, an oxide high temperature superconductor that excels in both crystallographic integrity and crystallographic orientation can be epitaxially grown by virtue of the fact that the second buffer layer composed of $Cu_{1-x}M_xSr_2CaCuO_{8-w}$ prevents the interfacial reaction between Ce in the first buffer layer composed of $CeO_2$ on the sapphire R face (1, −1, 0, 2) substrate of a low dielectric constant (as low as about 10) and Ba in the oxide high temperature superconductor thin film being epitaxially grown.

In a method as set forth in the present invention, the said oxide high temperature superconductor thin film containing Ba as a constituent element thereof, may be epitaxially grown whereby an amorphous phase composed to form this oxide high temperature superconductor is deposited on the said second buffer layer and the deposited amorphous phase is heat-treated in an oxygen atmosphere at a pressure of 1.0 to 10 atm in the presence of $Ag_2O$ or AgO, or alternatively in the presence of Tl.

In a method as set forth in the present invention, the said oxide high temperature superconductor thin film containing Ba as a constituent element thereof, may be epitaxially grown whereby an amorphous phase composed to form this oxide high temperature superconductor is deposited on the said buffer layer and the deposited amorphous phase is heat-treated in an oxygen atmosphere at a pressure of 1.0 to 10 atm in the presence of $Ag_2O$ or AgO, or alternatively in the presence of Tl.

The present invention also provides a method of making an oxide thin film by epitaxially growing on a sapphire R face (1, −1, 0, 2) substrate an oxide containing Ba as a constituent element thereof and selected from the group that consists of an oxide magnetic material, an oxide dielectric and an oxide conductor, characterized in that the method comprises the steps of:

forming a first buffer layer made of a $CeO_2$ thin film on the said sapphire substrate, forming on the said first buffer layer a second buffer layer made of a thin film of the said oxide in which Ba is substituted with Sr, and epitaxially growing the said oxide on the said second buffer layer. According to this method makeup, an oxide thin film that excels in properties can be epitaxially grown by virtue of the fact that a thin film of an oxide containing Ba as a constituent element thereof and selected from the group that consists of an oxide magnetic material, an oxide dielectric and an oxide conductor can be formed on the CeO$_2$ buffer layer on the sapphire substrate without reacting with Ce in the CeO$_2$ buffer layer.

BRIEF DESCRIPTION OF THE DRAWINGS

The present invention will better be understood from the following detailed description and the drawings attached hereto showing certain illustrative forms of implementation of the present invention. In this connection, it should be noted that such forms of implementation illustrated in the accompanying drawings hereof are intended in no way to limit the present invention but to facilitate an explanation and understanding thereof. In the drawings:

FIG. 1 shows an AFM (Atomic Force Microscopic) image of a surface of a CeO$_2$ (100) layer grown on a sapphire R (1, −1, 0.2) face substrate;

BEST MODES FOR CARRYING OUT THE INVENTION

Figure 2:
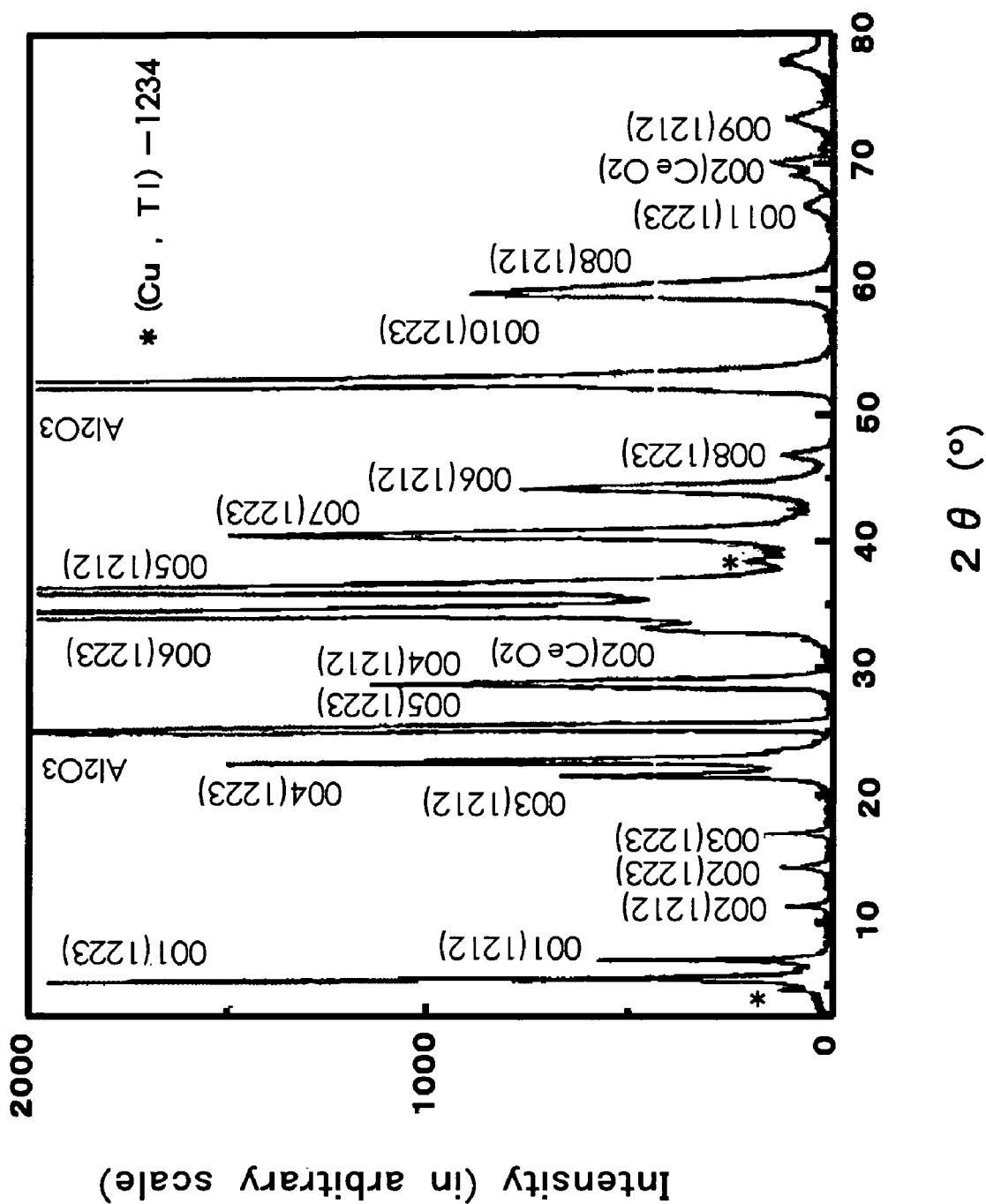
FIG. 2 is a diagram showing a diffraction pattern by XRD (X-ray diffractometer) of an oxide high temperature superconductor fabricated in accordance with the present invention.

Hereinafter, the present invention will be described in detail with reference to certain suitable forms of implementation thereof illustrated in the drawing figures.

At the outset, mention is made of an oxide high temperature superconductor fabricating method of the present invention as regards a specific form of implementation thereof.

Of superconductors having a superconducting transition temperature of not less than 77 K, a Cu family oxide high temperature superconductor such as CuTl-[1223] or CuTl-[1234] (see Kotai Butsuri [Solid State Physics], Vol. 35, No. 5, 2000), namely having a composition expressed by composition formula: $Cu_{1-x}Tl_xBa_2Ca_2Cu_3O_{8-w}$, or composition formula: $Cu_{1-x}Tl_xBa_2Ca_3Cu_4O_{10-w}$ where $0 \leq x-1$ and $0 \leq w \leq 4$ is a material having a lowest microwave surface resistance. Realizing an excellent microwave device makes it necessary to select a substrate having a low dielectric constant and at the same time to make a good lattice match between a superconductor thin film and the substrate.

While a single crystal sapphire R (1, −1, 0,2) face substrate is optimum as it is of low cost, large in surface area and low in dielectric constant, it cannot be used as it is because of its too-large lattice mismatch with a Cu family oxide high temperature superconductor thin film.

In order to solve this problem, it is known to be effective to use a CeO$_2$ (100) buffer layer on the sapphire R (1, −1, 0,2) face substrate.

A specific example of the CeO$_2$ layer grown on the sapphire substrate is given below.

FIG. 1 shows an AFM (Atomic Force Microscopic) image of a surface of a CeO$_2$ (100) layer grown on a sapphire R (1, −1, 0, 2) face substrate. A specimen was formed from a sapphire R (1, −1, 2, 2) face substrate held at a temperature of 525° C. which had a CeO$_2$ layer built up thereon to a thickness of 200 nm by magnetron RF sputtering in a mixed gas of Ar at 5 mTorr and N$_2$O at 10 mTorr whereafter it was heat-treated at a temperature of 1100° C.

As is apparent from FIG. 1, it is seen that CeO$_2$ grains are rectangular and at the same time are aligned in the directions of <−1, 1, 0, 1> and <1, 1, −2, 0>. Thus, CeO$_2$ is an optimum material to devise a lattice match between the sapphire substrate and the oxide high temperature superconductor thin film.

However, if it is attempted to grow an oxide high temperature superconductor thin film epitaxially on a sapphire substrate having CeO$_2$ formed thereon as a buffer layer, the problem arises that the epitaxial growth temperature of the oxide high temperature superconductor thin film causes Ba in the oxide high temperature superconductor thin film to react with Ce, forming BaCeO$_3$, thus preventing the oxide high temperature superconductor thin film from being satisfactory in both crystallographic integrity and crystallographic orientation.

The present inventors have discovered that this problem is solved if there is built up on the CeO$_2$ layer as a first buffer layer a thin film as a second buffer layer of an oxide high temperature superconductor in which Ba as a constituent element thereof is substituted with Sr that does not readily react with Ce and then a Ba containing oxide high temperature superconductor thin film is allowed to grow epitaxially on the second buffer layer, and have thus arrived at the present invention. To wit, the thin film in which Sr is substituted for Ba in the oxide high temperature superconductor thin film is akin in crystallographic structure and lattice constant to the oxide high temperature superconductor thin film to be epitaxially grown thereon and extremely high in lattice matching with the latter, and functions as an optimum buffer layer in which Sr does not readily reacts with Ce; hence it gives the oxide high temperature superconductor thin film excellent crystallographic integrity and orientation.

Thus formed in accordance with the present invention, an oxide high temperature superconductor in which an oxide high temperature superconductor thin film containing Ba as a constituent element thereof is formed on a crystalline substrate is characterized in that it comprises a first buffer layer for alleviating or reducing a lattice mismatch between the crystalline substrate and the oxide high temperature superconductor thin film, and a second buffer layer of a Sr oxide formed on the first buffer layer in order to act as a barrier to Ba diffusion from the high temperature superconductor thin film, interposed between the crystalline substrate and the oxide high temperature superconductor thin film. As a result, an oxide high temperature superconductor is obtained that excels in both crystallographic integrity and crystallographic orientation by virtue of the fact that even if the first buffer layer for reducing the lattice mismatch of the substrate with the oxide high temperature superconductor thin film is made of a material that readily brings about a surface reaction with Ba in the oxide high temperature superconductor thin film, the second buffer layer prevents the occurrence of such a surface or interfacial reaction.

Next, a first specific example of the present invention is shown below.

First, mention is made of how a specimen was prepared. A sapphire R (1, −1, 2, 0) face substrate was heat-treated at a temperature of 1100° C. for a period of 2 hours, and then its surface was smoothened and made clean. The resulting sapphire substrate was held at a temperature of 600° C. and had a CeO$_2$ layer built up thereon to a thickness of 15 nm by magnetron RF sputtering in a mixed gas atmosphere of Ar at 5 mTorr and $N_2O$ at 10 mTorr.

Subsequently, the substrate with its temperature lowered to 50° C. had formed thereon, as the thin film in which Ba in the composition: $Cu_{1-x}Tl_xBa_2CaCu_2O_{8-w}$ is substituted with Sr, an amorphous film of $Cu_{1-x}Tl_xSr_2CaCu_2O_{8-w}$ to a film thickness of 200 nm by magnetron RF sputtering.

Next, this amorphous film had built up thereon an amorphous film having the composition of an oxide high temperature superconductor of $CuTlBa_2Ca_2Cu_3O_{10-w}$ as to a film thickness of 700 nm by magnetron RF sputtering.

Thereafter, the specimen was taken out of the magnetron RF sputtering apparatus and was charged, together with a thallium containing high temperature superconductor disk (composed of $CuTl-Ba_2Ca_2Cu_3O_y$, and of 17.5 mm in radius, 4 mm thick and 10 g in weight) and 50 mg of $Tl_2O_3$ powder particles dispersed thereon, in a hermetically sealed container made of silver (a board shaped container of 18 mm in radious and 10 mm in height) and was then heat-treated at a temperature of 860° C. for a time period of 30 minutes.

FIG. 2 is a diagram showing a diffraction pattern by XRD (X-ray diffractometer) of the oxide high temperature superconductor fabricated in accordance with the present invention. In the diagram, the numerals affixed to the peaks of the diffraction pattern indicate their corresponding Miller face indices, the numerals in the parentheses indicate their corresponding oxide high temperature superconductors, and the lettering $Al_2O_3$ affixed to some peaks indicates that they are diffraction peaks for the sapphire substrate. As is apparent from the diagram, it is seen that a $CuTlBa_2Ca_2Cu_3O_{10-w}$ oxide type high temperature superconductor fabricated in accordance with a method of the present invention, namely CuTl-[1223] is epitaxially grown oriented along the crystallographic c-axis.

Figure 3:
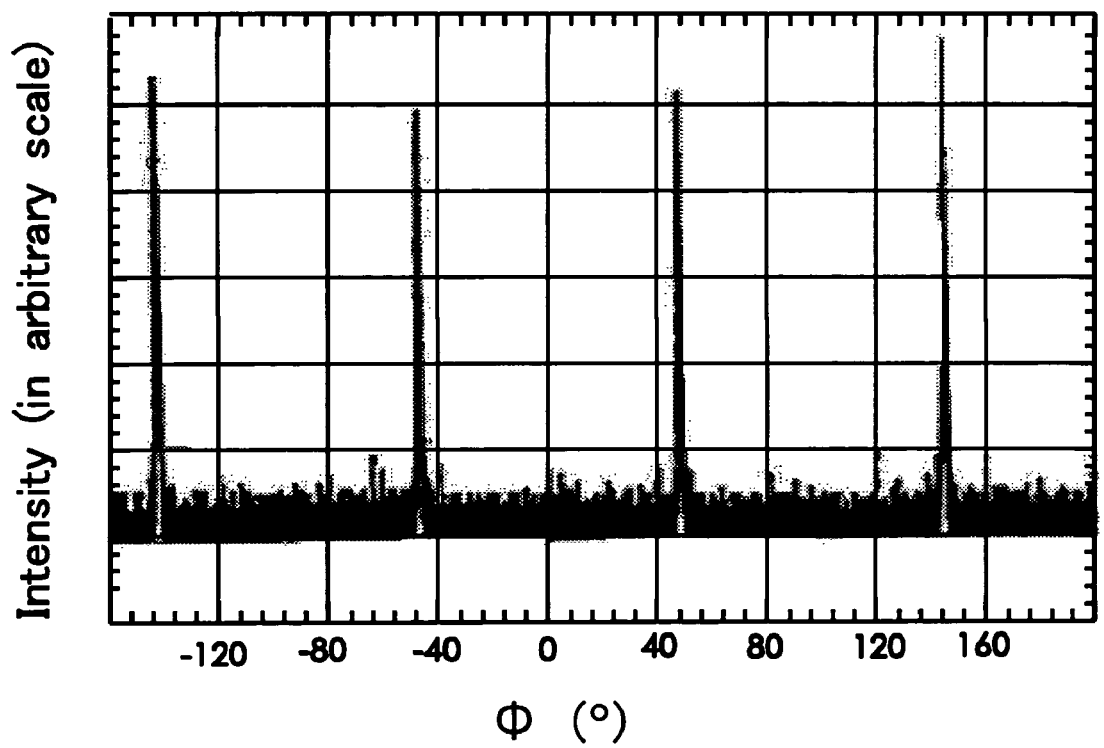
FIG. 3 is a diagram showing results of measurement by XRD of an in-plane orientation of the oxide high temperature superconductor fabricated in accordance with the present invention.

FIG. 3 is a diagram showing results of measurement by XRD indicating an in-plane orientation of the oxide high temperature superconductor fabricated in accordance with the present invention. It is a diagram showing results of the measurement by XRD in which with the angle of diffraction 2 θ held at the angle of diffraction for the (107) Miller index face, the specimen is rotated at an angle of rotation φ about an axis perpendicular to the plane of incidence. As is apparent from the diagram, it is seen that an oxide high temperature superconductor fabricated in accordance with a method of the present invention is excellent in its in-plane orientation, too.

Figure 4:
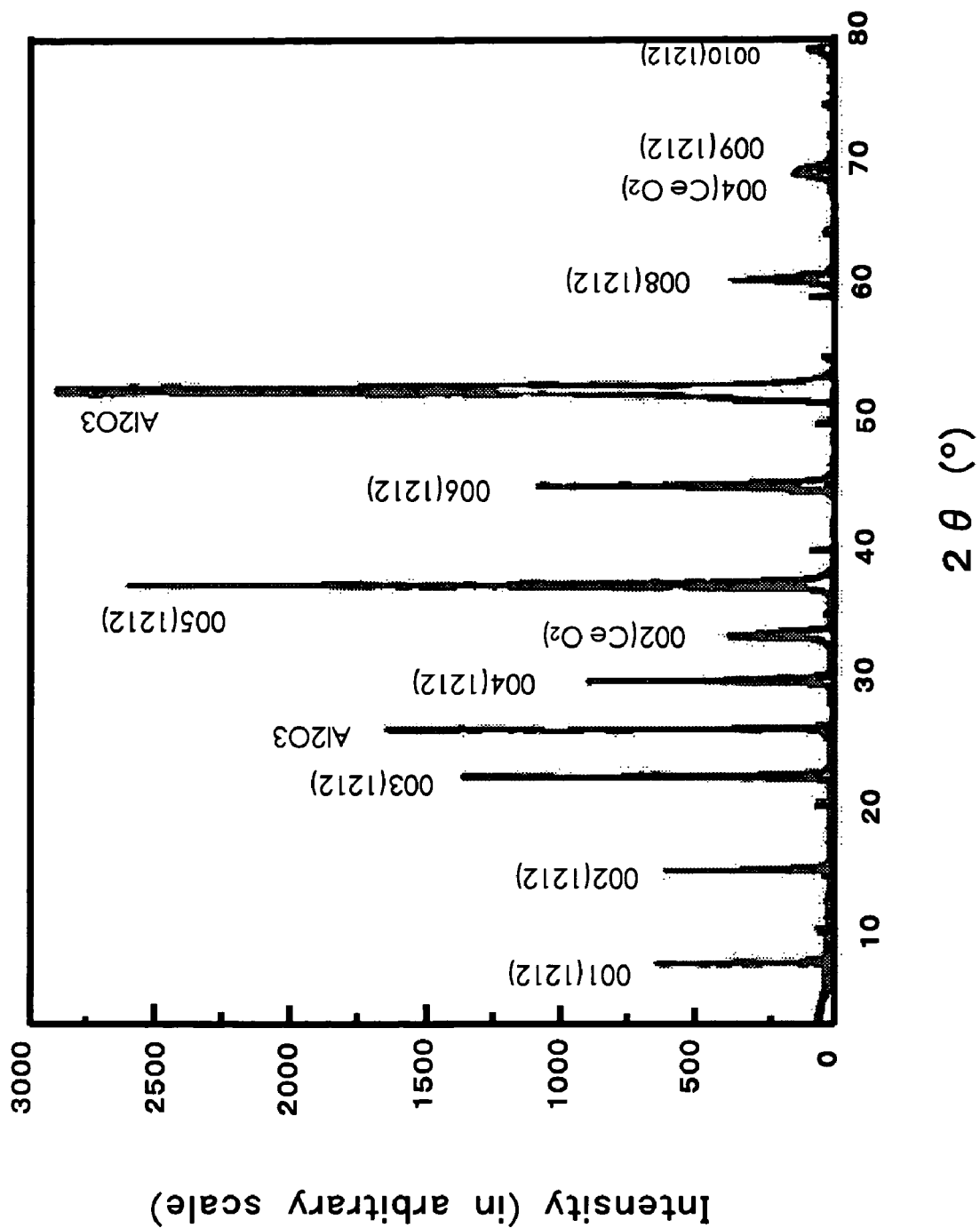
FIG. 4 is a diagram showing a diffraction pattern by XRD indicating that Sr in a second buffer layer does not react with Ce in a first buffer layer, which layers are made in accordance with the present invention.

Shown next are results of experiment confirming that Sr in the second buffer layer does not react with Ce in the first buffer layer. A specimen used was identical to that used in the first specific example except that it did not have the amorphous film built up thereon, which has the composition of an oxide high temperature superconductor of $CuTlBa_2Ca_2Cu_3O_{10-w}$, and that it was heat-treated at a temperature of 890° C. higher than that in the first specific example. FIG. 4 is a diagram showing a diffraction pattern by XRD indicating that Sr in the second buffer layer does not react with Ce in the first buffer layer. In the diagram, the numerals affixed to the peaks of the diffraction pattern indicate their corresponding Miller face indices, the numerals in the parentheses indicate their corresponding oxide high temperature superconductor's type, and the letterings $CeO_2$ and $Al_2O_3$ in the parentheses affixed to some peaks indicate that they are diffraction peaks for the $CeO_2$ and the sapphire substrate. As is apparent from the diagram, no diffraction peak by $SrCeO_3$ is observed. It is also shown that the diffraction strength for $CeO_2$ remains substantially unchanged compared with that before the heat-treatment. From these, it has been confirmed that no reaction takes place between Sr in the second buffer layer substituted for Ba in the oxide high temperature superconductor and Ce in the first buffer layer composed of $CeO_2$.

Next, a second specific example of the present invention is given.

The second specific example is identical to the first specific example except that an $Ag_{20}$ powder is used instead of the $Tl_2O_3$ powder.

Using this method, a $CuTlBa_2Ca_2Cu_3O_{10-w}$ oxide type high temperature superconductor, namely CuTl-[1223], was fabricated. Its results of measurement by XRD indicated the same characteristics as in FIGS. 2 and 3, and its superconducting transition temperature Tc and critical current density Jc were found to be 100 K and $4\times10^4 A/cm^2$, respectively. These superconducting properties are found to be somewhat inferior to those with a CuTl-[1223] oxide type high temperature superconductor fabricated on a $SrTiO_3$ substrate, but this is apparently due to cracking and hence can obviously be improved if a preventive measure for the cracking is taken.

While the present invention has been shown in the above specific examples as applied to a CuTl-[1223] oxide type high temperature superconductor, it is obvious that the invention is applicable to any oxide high temperature superconductor containing Ba as a constituent element and having a composition expressed by

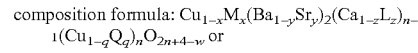

composition formula: $Cu_{1-x}M_x(Ba_{1-y}Sr_y)_2(Ca_{1-z}L_z)_{n-1}(Cu_{1-q}Q_q)_nO_{2n+4-w}$ or

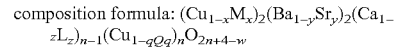

composition formula: $(Cu_{1-x}M_x)_2(Ba_{1-y}Sr_y)_2(Ca_{1-z}L_z)_{n-1}(Cu_{1-q}Q_q)_nO_{2n+4-w}$ where:
M represents Tl, Hg, Bi, Pb, In, Ga, Al, B, C, Si, Sn, Ag, Au, S, N, P, Mo, Re, Os, Cr, Ti, V, Fe, one element in the lanthanide series, or one or more alkali metal elements,
L represents Mg, Y, or one or more elements in the lanthanide series.
Q represents either or both of Mg and Zn, and
$0 \leq x \leq 1, 0 \leq y \leq 1, 0 \leq z \leq 1, 0 \leq q \leq 0.1, 0 \leq w \leq 4$, and $2 \leq n \leq 5$.

While the second buffer layer is shown in the above specific examples as composed of an oxide high temperature superconductor identical to a target oxide high temperature superconductor to be epitaxially grown except that Ba therein is substituted with Sr, it is obvious that it may be composed of an oxide high temperature superconductor that is not identical but similar to the target oxide high temperature superconductor and which has its Ba constituent substituted with Sr.

While the second buffer layer is shown in the above specific examples as composed of an oxide high temperature superconductor identical to a target oxide high temperature superconductor except that Ba therein is substituted with Sr, it is obvious that it may be a Sr oxide film that is well lattice-matched with the target oxide high temperature superconductor.

Accordingly, as a second form of implementation of the present invention, there is provided an oxide high temperature superconductor made by an oxide high temperature superconductor thin film containing Ba as a constituent element and formed on a crystalline substrate, characterized in that it comprises a buffer layer composed of a Sr oxide and interposed between the crystalline substrate and the oxide high temperature superconducting film for reducing a lattice mismatch between them and also for serving as a barrier to the diffusion of Ba from the oxide high temperature superconductor thin film. An oxide high temperature superconductor that excels in both crystallographic integrity and orientation can here again be obtained by virtue of the fact that a Sr oxide alleviates or reduces lattice mismatch between the crystalline substrate and an oxide high temperature superconducting film and at the same time prevents the interfacial reaction between the crystalline substrate and Ba in the oxide high temperature superconducting film which will otherwise occur if the substrate is made of a material that contains a substance liable to interfacially reacting with Ba from the oxide high temperature superconductor thin film.

While the present invention has been shown in the above specific examples as regards a Ba containing oxide high temperature superconductor grown epitaxially on a sapphire substrate, it is obvious that the invention is not limited to such an oxide high temperature superconductor but is applicable to any one of oxide magnetic material, an oxide dielectric and an oxide conductor, which contains Ba and is epitaxially grown on a sapphire substrate.

INDUSTRIAL APPLICABILITY

The present invention thus permits fabricating on a substrate of low dielectric constant an oxide high temperature superconductor that is high in crystallographic integrity and at the same time excels in crystallographic orientation.

What is claimed is:

1. An oxide high temperature superconductor comprising a crystalline substrate, a first buffer layer formed on said crystalline substrate, a second buffer layer formed on said first buffer layer, and an oxide high temperature superconductor thin film formed on said second buffer layer, wherein
said first buffer layer is made of $CeO_2$,
said second buffer layer has a composition formula:

$$Cu_{1-x}M_xSr_2CaCu_2O_{8-w},$$

said oxide high temperature superconductor thin film has a composition formula:

$$(Cu_{1-x}M_x)_2(Ba_{1-y}Sr_y)_2(Ca_{1-z}L_z)_{n-1}(Cu_{1-q}Q_q)_nO_{2n+4-w},$$

M represents Tl, Hg, Bi, Pb, In, Ga, Al, B, C, Si, Sn, Ag, Au, S, N, P, Mo, Re, Os, Cr, Ti, V, Fe, one element in the lanthanide series, or one or more alkali metal elements,
L represents Mg, Y, or one or more elements in the lanthanide series,
Q represents either or both of Mg and Zn,
$0 \leq x \leq 1$, $0 \leq y < 1$, $0 \leq z \leq 1$, $0 \leq q < 0.1$, $0 \leq w \leq 4$, and $2 \leq n \leq 5$;
wherein said second buffer layer completely overlies the first buffer layer, and
said oxide superconductor thin film has a uniform orientation, and said crystalline substrate is a sapphire substrate.

2. An oxide high temperature superconductor comprising a crystalline substrate, a first buffer layer formed on said crystalline substrate, a second buffer layer formed on said first buffer layer, and an oxide high temperature superconductor thin film formed on said second buffer layer, wherein
said first buffer layer is made of $CeO_2$,
said second buffer layer has a composition formula:

$$Cu_{1-x}M_xSr_2CaCu_2O_{8-w},$$

said oxide high temperature superconductor thin film has a composition formula:

$$(Cu_{1-x}M_x)_2(Ba_{1-y}Sr_y)_2(Ca_{1-z}L_z)_{n-1}(Cu_{1-q}Q_q)_nO_{2n+4-w},$$

M represents Tl, Hg, Bi, Pb, In, Ga, Al, B, C, Si, Sn, Ag, Au, S, N, P, Mo, Re, Os, Cr, Ti, V, Fe, one element in the lanthanide series, or one or more alkali metal elements,
L represents Mg, Y, or one or more elements in the lanthanide series,
Q represents either or both of Mg and Zn,
$0 \leq x \leq 1$, $0 \leq y < 1$, $0 \leq z \leq 1$, $0 \leq q < 0.1$, $0 \leq w \leq 4$, and $2 \leq n \leq 5$;
wherein said second buffer layer completely overlies the first buffer layer, and said oxide superconductor thin film has a uniform orientation, and said crystalline substrate is a sapphire substrate.

3. An oxide high temperature superconductor as set forth in claim 1, wherein said sapphire substrate has a sapphire R face (1, −1, 0, 2).

4. An oxide high temperature superconductor as set forth in claim 2, wherein said sapphire substrate has a sapphire R face (1, −1, 0, 2).

* * * * *